United States Patent
Lew et al.

(10) Patent No.: US 8,093,749 B1
(45) Date of Patent: Jan. 10, 2012

(54) SHARING REDUNDANT POWER SUPPLY MODULES AMONG PHYSICAL SYSTEMS

(75) Inventors: Hogan Lew, Sunnyvale, CA (US); Ankur Singla, San Jose, CA (US); Harshad Nakil, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 303 days.

(21) Appl. No.: 12/021,344

(22) Filed: Jan. 29, 2008

(51) Int. Cl.
H02J 1/10 (2006.01)
H02J 3/00 (2006.01)
H02J 3/14 (2006.01)
H02M 1/10 (2006.01)

(52) U.S. Cl. .......... 307/29; 307/18; 307/19; 307/23; 307/65; 713/330; 713/340; 320/103; 320/117; 320/118; 320/119; 320/124; 320/125; 320/126; 320/127; 320/128; 320/137

(58) Field of Classification Search .............. None
See application file for complete search history.

(56) References Cited

U.S. PATENT DOCUMENTS

| | | | | |
|---|---|---|---|---|
| 3,229,164 A | * | 1/1966 | McCartney et al. | 361/72 |
| 5,266,838 A | * | 11/1993 | Gerner | 307/19 |
| 5,381,554 A | * | 1/1995 | Langer et al. | 714/14 |
| 5,745,670 A | * | 4/1998 | Linde | 714/22 |
| 5,761,084 A | * | 6/1998 | Edwards | 700/293 |
| 5,917,250 A | * | 6/1999 | Kakalec et al. | 307/18 |
| 6,034,506 A | * | 3/2000 | Hall | 320/117 |
| 6,680,547 B1 | * | 1/2004 | Dailey | 307/31 |
| 6,785,827 B2 | * | 8/2004 | Layton et al. | 713/300 |
| 7,363,520 B1 | * | 4/2008 | Maier et al. | 713/300 |
| 7,750,501 B2 | * | 7/2010 | Huang | 307/45 |
| 7,932,631 B2 | * | 4/2011 | Chen et al. | 307/29 |
| 2004/0070280 A1 | * | 4/2004 | Nakata et al. | 307/69 |
| 2004/0124709 A1 | * | 7/2004 | Eisenberger et al. | 307/29 |
| 2006/0097576 A1 | * | 5/2006 | Kobayashi et al. | 307/9.1 |

OTHER PUBLICATIONS

JP 2001292567 to Yasuzawa, english abstract, Oct. 19, 2001.*
JP Pub 2005057826 to Hattori et al., english abstract, Mar. 3, 2005.*

* cited by examiner

*Primary Examiner* — Rexford Barnie
*Assistant Examiner* — Justen Fauth
(74) *Attorney, Agent, or Firm* — Harrity & Harrity, LLP

(57) ABSTRACT

A system may include a switchover element configurable to source or sink power from or to an electronic device electrically coupled to the switchover element and a controller in communication with the switchover element. The controller may be configured to determine if the electronic device is healthy. When the electronic device is healthy, the controller may configure the switchover element to deliver power from the electronic device to the system and configure the switchover element to provide the power to any unhealthy electronic device electrically coupled to the system.

21 Claims, 7 Drawing Sheets

SHARING REDUNDANT POWER SUPPLY MODULES AMONG PHYSICAL SYSTEMS

BACKGROUND

A redundant power system (RPS) may supply power to a device when the primary power supply for the device fails or otherwise can no longer deliver sufficient power to the device. Unlike an uninterruptible power supply that provides energy to attached devices for a relatively short period of time, RPS can transparently take over the role of the failed power supply and provide power to the device for an extended period of time.

SUMMARY

According to one aspect, a method may include monitoring health statuses of two or more electronic devices that are attached to an electronic module, configuring a switchover element to enable one of the electronic devices to provide power to the electronic module when the one of the electronic devices is healthy, and sourcing power from the electronic module to another of the electronic devices when the other of the electronic devices becomes unhealthy, the sourced power including power provided by the one of the electronic devices.

DETAILED DESCRIPTION OF PREFERRED EMBODIMENTS

The following detailed description refers to the accompanying drawings. The same reference numbers in different drawings may identify the same or similar elements.

The term "healthy" device, as used herein, may refer to a device whose internal power supply is fully operational. Conversely, as used herein, the term "unhealthy" device may refer to a device whose internal power supply is not capable of supplying sufficient power to the device. An unhealthy device may operate normally if the device is provided with necessary power.

The term "source-enabling" a device, as used herein, may refer to enabling a bus (e.g., a wire) that interconnects the device to another device to deliver power to the other device over the bus. The term "sink-enabling" a device, as used herein, may refer to enabling a bus to deliver power from the other device to the device.

In the following, a redundant power system (RPS) module may supply and/or receive power to/from electronic devices in a system. The RPS module may use the power that is received from healthy electronic devices to support unhealthy electronic devices. By allowing the healthy electronic devices to act as backup power supplies, the RPS module may increase the overall reliability of the system. If a RPS module with M power supplies supports N electronic devices with M total internal backup supplies (e.g., 1 internal backup power supply for each electronic device), the RPS module and the electronic devices may provide (N+M):N redundancy against failures. In contrast, systems that use RPS devices without the capability to reroute power from the attached electronic devices may provide a much lower level of redundancy.

Figure 1:
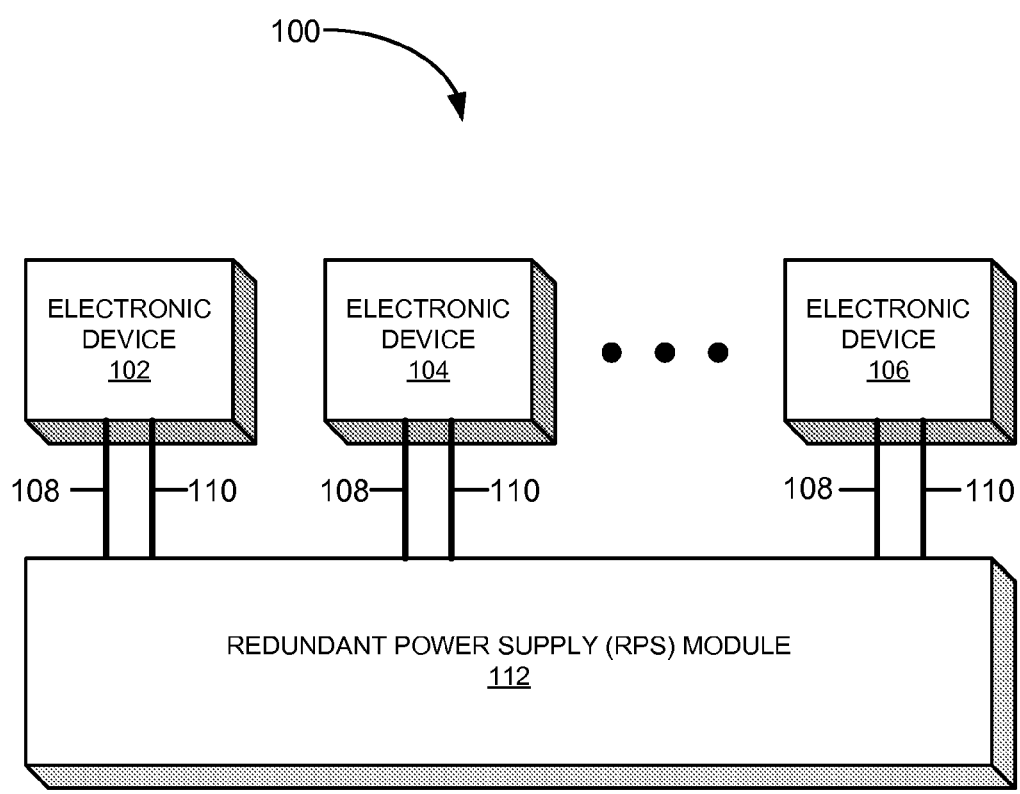
FIG. 1 shows an exemplary system in which concepts described herein may be implemented.

FIG. 1 shows an exemplary system 100 in which concepts described herein may be implemented. As shown, system 100 may include electronic device 102, electronic device 104 . . . , electronic device 106, power lines 108, communication lines 110, and RPS module 112. In other implementations, system 100 may include fewer, additional or different elements than those illustrated in FIG. 1. Moreover, electronic devices 102-106 may or may not be similar or identical to each other.

Each of electronic devices 102-106 may include devices for receiving and/or supplying power to RPS module 112 and for exchanging information with RPS module 112. While electronic devices 102-106 may be implemented as different types of devices (e.g., a network switch, a digital video disk (DVD) player, a computer, etc.), in the following paragraphs, electronic devices 102-106 will be described in terms of a network switch.

Each of power lines 108 may provide an electrical path for RPS module 112 to receive and/or supply power to an electronic device (e.g., electronic device 102). Each of communication lines 110 may provide for communication between one of electronic devices 102-106 and RPS module 112. For example, electronic device 102 may send information about the status of its internal power supplies (e.g., operational status) to RPS module 112 over one of communication lines 110.

RPS module 112 may include devices for providing redundancy against power supply failures. More specifically, if an internal power supply of an electronic device (e.g., electronic device 102) fails, RPS module 102 may detect the failure via one of the corresponding power lines 108 and send power to the unhealthy device. Furthermore, if there are healthy electronic devices, RPS module 102 may route power from the healthy electronic devices to the unhealthy electronic device. By permitting healthy electronic devices to supply power to unhealthy ones, RPS module 112 may provide increased protection against power supply failures.

Figure 2:
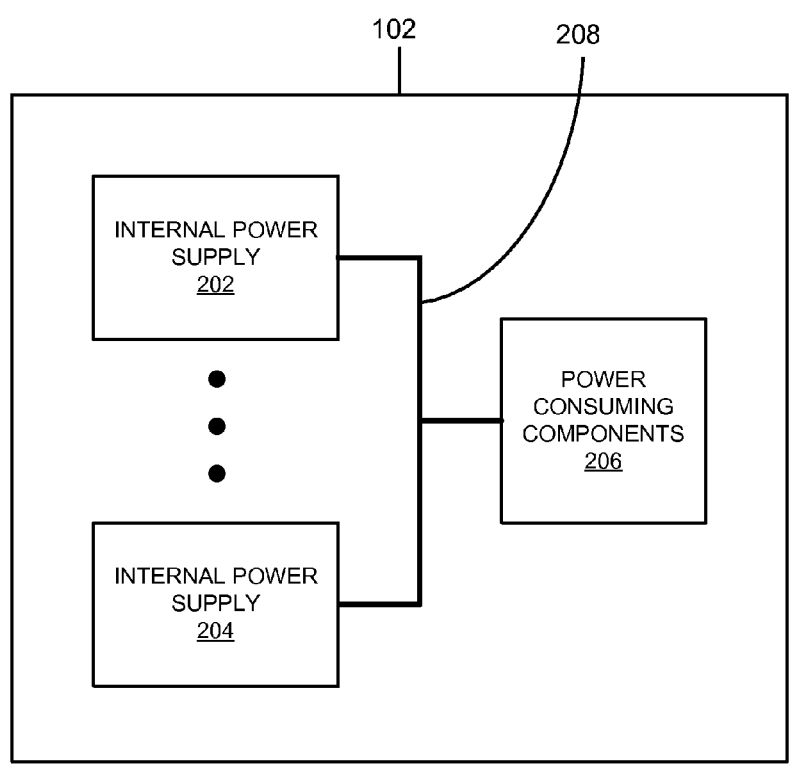
FIG. 2 is a block diagram of an exemplary electronic device of FIG. 1.

FIG. 2 is a block diagram of exemplary electronic device 102. As shown, electronic device 102 may include one or more internal power supplies 202-204, a power consuming component 206, and an internal bus 208. In some implementations, electronic device 102 may include fewer, additional, or different components than those depicted in FIG. 2. For example, electronic device 102 may not necessarily include an internal power supply and may receive all power from an external source (e.g., a redundant power system). In another example, internal power supplies 202-204 may deliver different voltages and/or currents to power consuming component 206.

Each of internal power supplies 202-204 may deliver direct current (DC) power. In the situation where there are two internal power supplies 202 and 204, one may function as a primary power supply and the other as a secondary power supply. Both power supplies may be active and may provide power to the load. Furthermore, if one of internal power supplies 202-204 fails, the other may be capable of supplying enough power to component 206. In many implementations, internal power supplies may be capable of delivering different levels of voltages/currents. However, in the following discussions, for the sake of simplicity, internal power supplies 202-204 will be described or referred to as internal power supplies 202-204 that produce one level of voltage or current.

Power consuming component 206 may include one or more devices that use the power delivered from internal power supplies 202-204. In some situations, electronic device 102 may not include an internal power supply, and power consuming component 206 may thus receive all of its power from RPS module 112. Internal bus 208 may relay power from internal power supplies 202-204 to power consuming component 206. Additionally or alternatively, internal bus 208 may relay power from RPS module 112 to power consuming component 206.

Figure 3:
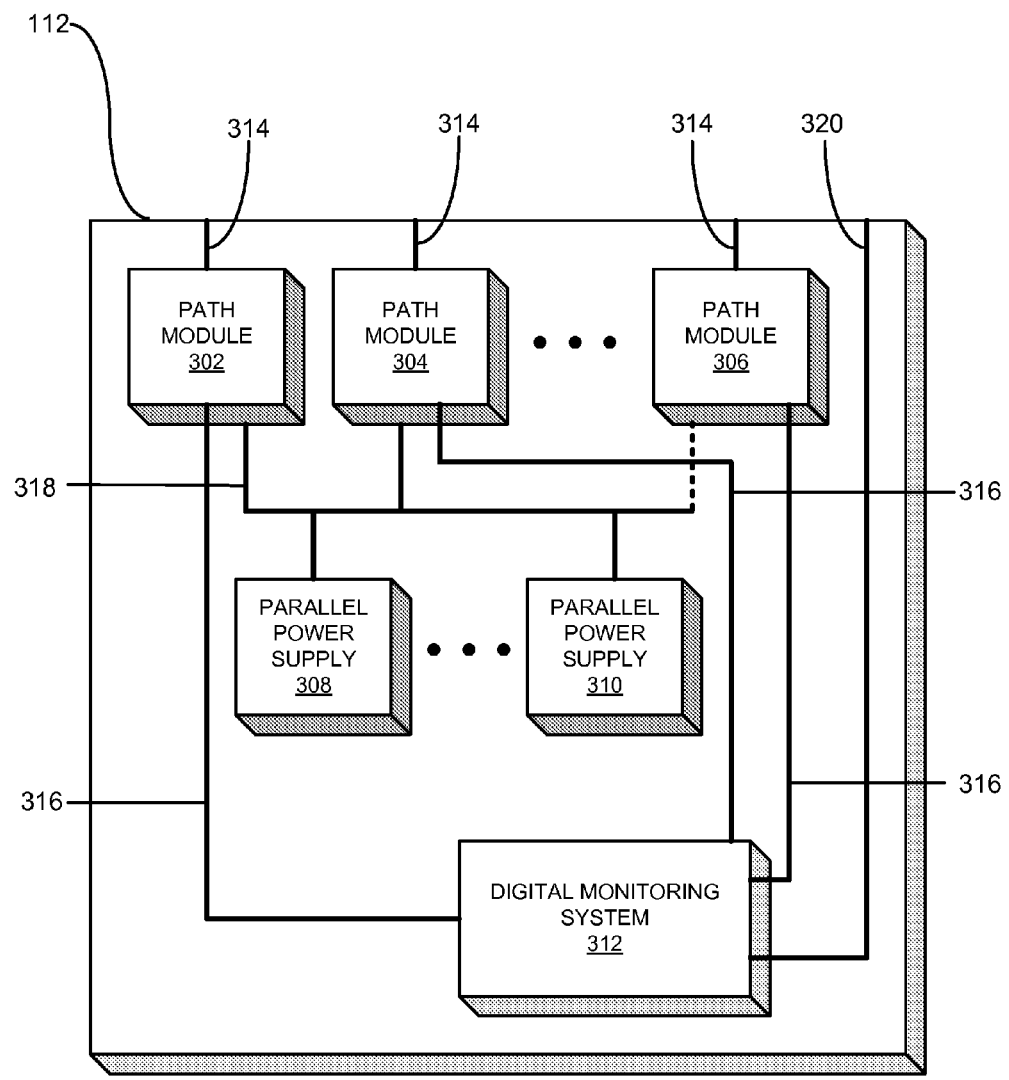
FIG. 3 is a block diagram of an exemplary redundant power system (RPS) module of FIG. 1.

FIG. 3 is a block diagram of an exemplary RPS module 112. As shown, RPS module 112 may include path modules 302-306, parallel power supplies 308-310, a digital monitoring system (DMS) 312, RPS buses 314, DMS lines 316, parallel buses 318, and DMS communication line 320. In other implementations, RPS module 112 may include fewer, additional, or different elements than those illustrated in FIG. 3.

Path modules 302-306 may include devices for redirecting or rerouting power that is delivered from/to electronic devices 102-106 and/or parallel power supplies 308-310. Each of path modules 302-306 may be provided for a power outlet in which an electronic device can be plugged. Parallel power supplies 308-310 may include devices for producing power that can be delivered to electronic devices 102-106 through path modules 302-306. In general, the number of parallel power supplies 308-310 may be independent of the number of path modules 302-306. In some implementations, path modules 302-306 may include a mechanism (e.g., a circuit) that may allow power to be supplied to RPS bus 314 without an immediate action by DMS 312.

DMS 312 may include a device for monitoring power levels at electronic devices 102-106 and for controlling path modules 302-306, to redirect power that is delivered to/from electronic devices 102-106 and parallel power supplies 308-310. More specifically, DMS 312 may have the capability to sense small changes in power at electronic devices 102-106 and to source-enable or sink-enable one or more electronic devices 102-106 that are attached to parallel power supplies 308-310 via path modules 302-306. In one implementation, DMS 312 may receive status information from electronic devices 102-106. Electronic devices 102-106 may obtain the status information by monitoring their own internal power supplies.

In implementations in which path modules 302-306 include the mechanism for delivering power to RPS without an immediate action by DMS 312, DMS 312 may enable the backup power to be provided when path modules 302-306 deem the backup power necessary. In some implementations, DMS 312 may receive commands from an electronic device or a management station to disable a particular electronic device or a parallel power supply from being electrically coupled to other elements of system 100. Additionally or alternatively, DMS 312 may send o status information to the electronic device or the management station.

RPS buses 314 may connect each of path modules 302-306 to one of electronic devices 102-106. Power that is transferred between path modules 302-306 may pass through RPS buses 314.

DMS lines 316 may provide paths for DMS 312 to control path modules 302-306. In addition, DMS lines 316 may provide paths through which DMS 312 detects one or more unhealthy electronic devices and/or failed parallel power supplies.

Parallel buses 318 may provide a common voltage rail that is shared among parallel power supplies 308-310. In addition, parallel buses 318 may include electronic devices (e.g., a field effect transistor (FET), a diode, etc.) that prevent currents from flowing into a failed parallel power supply (not shown). Consequently, if one of parallel power supplies 308-310 fails, the failed power supply may not draw current via parallel buses 318. Parallel buses 318, in some implementations, may be replaced with a crossbar based on FETs, which may provide the flexibility to connect one voltage rail to another.

DMS communication line 320 may permit DMS 312 to exchange information with a network device or one of electronic devices 102-106.

Figure 4:
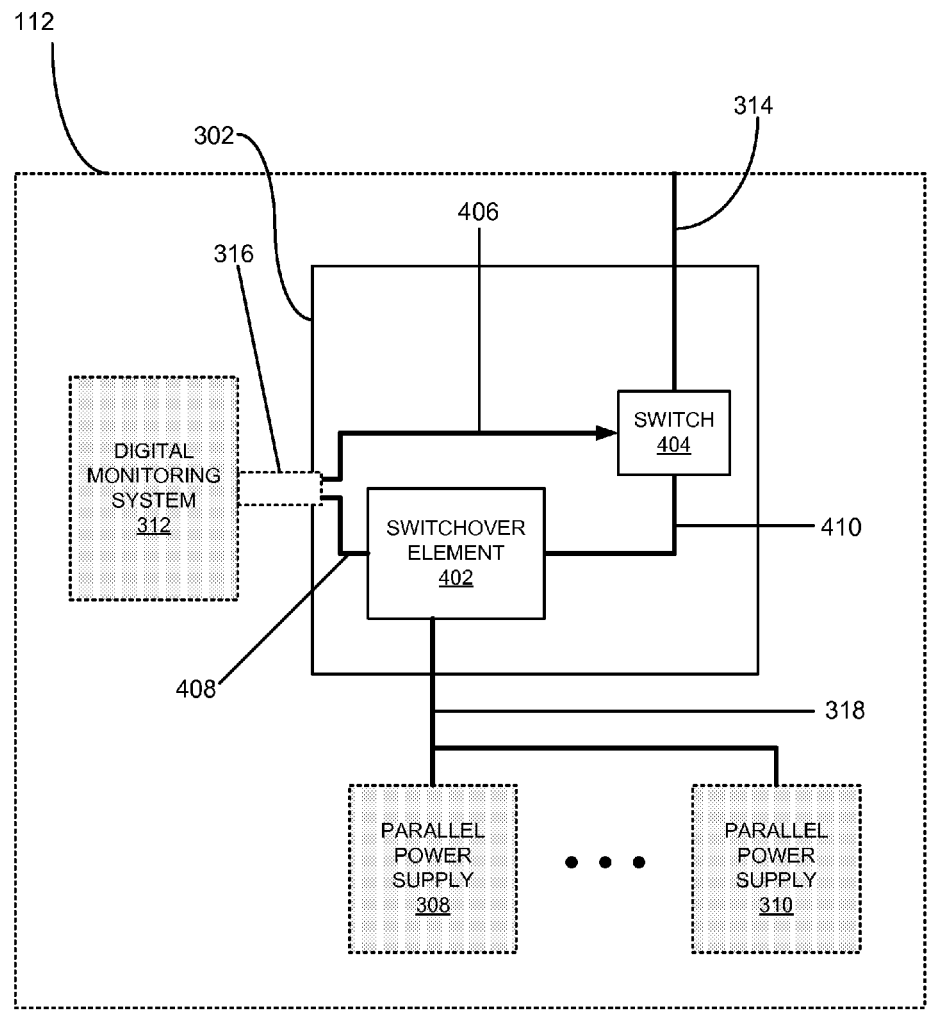
FIG. 4 is a block diagram of an exemplary path module of FIG. 3.

FIG. 4 is a block diagram of an exemplary path module 302. As shown, path module 302 may include a switchover element 402, a switch 404, a switch control line 406, and a source/sink enable line 408, and a path bus 410. In different implementations, path module 302 may include fewer, additional, or different elements than those depicted in FIG. 4. For example, path module 302 may or may not include switch 404.

Switchover element 402 may include a device that may be controlled by DMS 312 and may source-enable or sink-enable one or more of electronic devices 102-106 and/or parallel power supplies 308-310, as explained below. Switch 404 may include a device to electrically connect/disconnect RPS buses 314 from parallel power supplies 308-310. Switch control line 406 may carry commands from DMS 312 to switch 404 to connect RPS buses 314 to parallel power supplies 308-310. Connecting or disconnecting RPS buses 314 may electrically decouple electronic devices that are attached to RPS buses 314 from parallel power supplies 308. Source/sink enable line 408 may provide conductive paths for DMS 312 to control switchover element 402. As shown, switch control line 406 and source/sink enable line 408 may be part of DMS lines 316. Path bus 410 may permit current to flow between switchover element 402 and switch 404.

Figure 5:
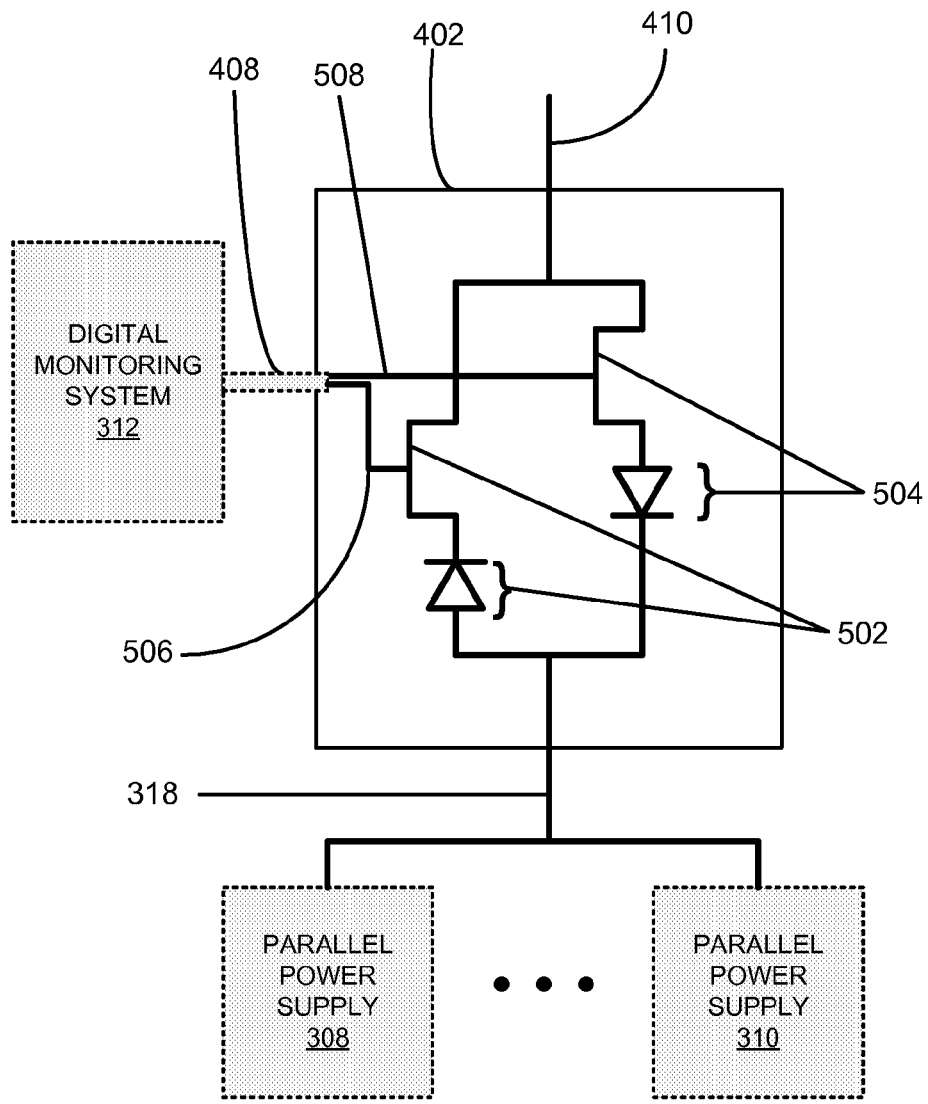
FIG. 5 is a block diagram of an exemplary switchover element of FIG. 4.

FIG. 5 is a block diagram of an exemplary switchover element 402 that is connected to DMS 312 and parallel power supplies 308-310. As shown switchover element 402 may include a transistor/diode pair 502 (e.g., a FET and a diode), a transistor/diode pair 504, a source-enable line 506, and a sink-enable line 508. In different implementations, switchover element 402 may include fewer, additional, or different components than those depicted in FIG. 6, as long as switchover element 402 allows power to be received and/or sent from RPS module 112. For example, switchover element 402 may be implemented as part of a device package with a cooling mechanism to redirect currents in place of transistor/diode pairs 502/504.

Transistor/diode pairs 502 and 504 may, based on the voltages supplied over lines 506 and 508, permit or prevent current to flow from path bus 410 to parallel buses 318. DMS 312 may thus control source-enable line 506 to enable parallel power supplies 308 and 310 to drive electronic devices 102-106. Similarly, DMS 312 may control sink-enable line 508 to enable power to be received from healthy electronic devices and routed to unhealthy electronic devices via parallel buses 318. Source-enable line 506 and sink-enable line 508 may be part of source/slink enable line 408.

Exemplary Processes for Sharing Redundant Power Supply Modules

Figure 6:
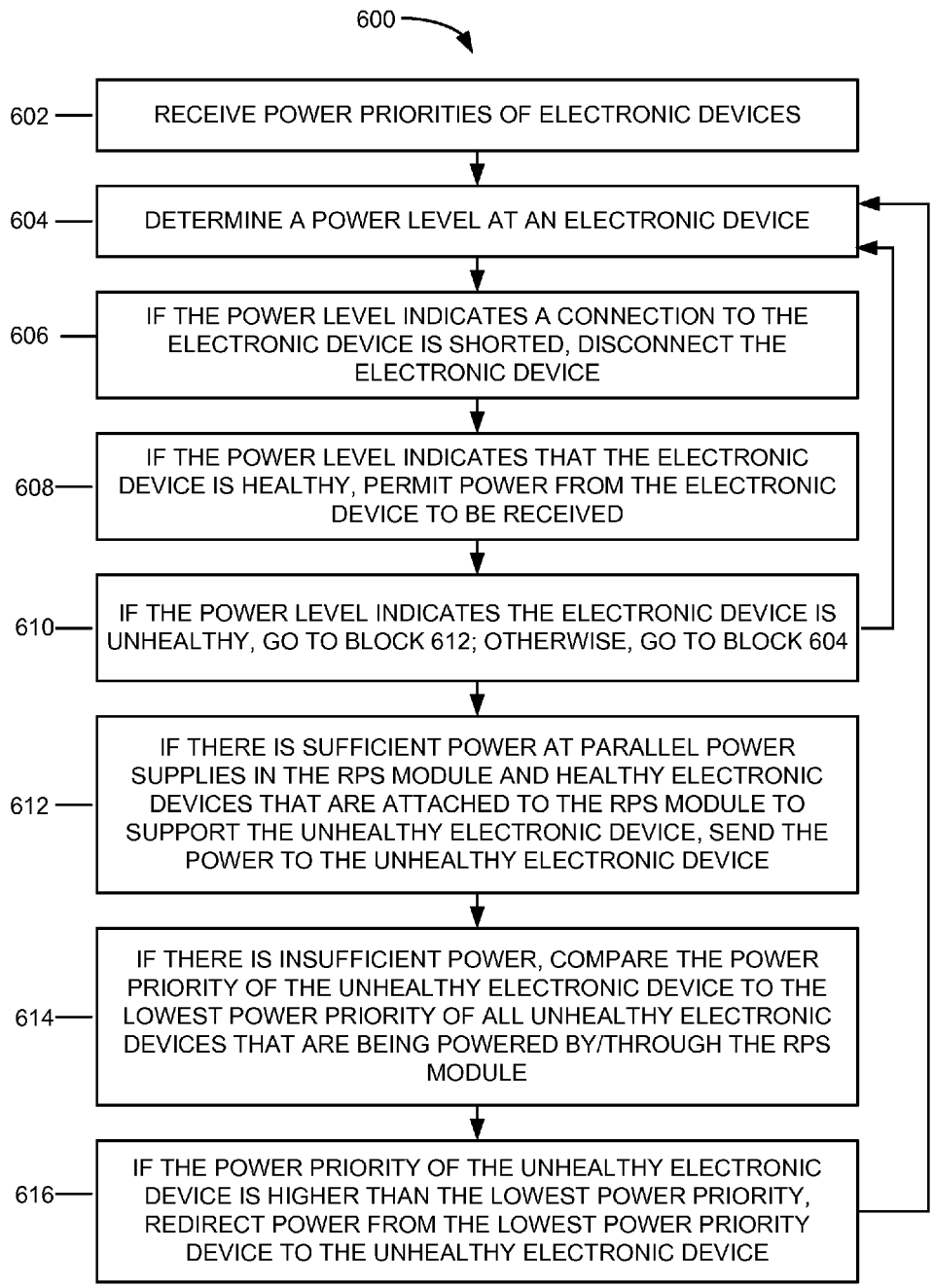
FIG. 6 is a flow diagram of an exemplary process for sharing the RPS module of FIG. 1.

The above paragraphs describe system elements that are related to devices and/or components for sharing RPS module 112. FIG. 6 is a flowchart showing an exemplary process 600 that is capable of being performed by one or more of these devices and/or components.

In process 600, if RPS module 112 with M power supplies supports N electronic devices with total M backup power supplies (e.g., 1 backup power supply for each electronic device), RPS 112 module and the electronic devices may provide (N+M):N redundancy against failures. In contrast, assuming each electronic device is equipped with one primary power supply and one backup power supply, processes that use RPS devices without the capability to reroute power from the attached electronic devices may provide only (N+1):N redundancy.

Process 600 may begin at block 602, where power priorities of electronic devices may be received at RPS module 112. A power priority may indicate which electronic devices have the highest priorities for receiving power from RPS module 112. RPS module 112 may use the power priorities to determine which electronic device may receive power when there is insufficient power in system 100 to support all unhealthy electronic devices that are attached to RPS module 112. For example, if electronic device A has a power priority of 1 and electronic device B has a power priority of 2, and if RPS module 112 has enough power to support only one device, RPS module 112 may send power only to electronic device A.

The power priorities may be received from a network device or a management station that is connected to DMS 312 of RPS module 112 via DMS communication lines 320. The network device/management station may provide a necessary user interface for the user to interact with DMS 312. In some implementations, RPS module 112 may include an interface port, or even a display via which the user may configure the power priorities.

A power level at an electronic device (e.g., electronic device 102) may be determined (block 604). DMS 312 may detect any changes in the power level at an electronic device that is attached to RPS module 112, by tapping into a component that is directly coupled to RPS buses 314 (not shown). Alternatively, electronic devices 102-106 may monitor their own internal power supplies and communicate their status to DMS 312.

If the power level indicates that a connection to the electronic device is shorted, the electronic device may be disconnected (block 606). For example, if RPS bus 314 has a short connection, DMS 312 may send a signal via switch control line 406 to switch 404 to disconnect RPS bus 314 from path bus 410 (FIG. 4).

If the power level indicates that the electronic device is healthy, power from the electronic device may be permitted to be received (block 608). To permit the power from the electronic device to be received, DMS 312 may sink-disable and source-enable the electronic device via a path module (e.g., path module 402) that is electrically coupled to one of RPS buses 314. Any excess power that is delivered to parallel buses 318 from healthy electronic devices may not enter parallel power supplies 308-310 and may be rerouted to unhealthy electronic devices via parallel buses 318.

If the power level indicates that the electronic device is unhealthy, process 600 may proceed to block 612. Otherwise, process 600 may return to block 604, to determine the power level at another electronic device that is attached to RPS module 112. An electronic device that does not include an internal power supply may be determined as being unhealthy, regardless of its power level.

At block 612, if there is sufficient power at parallel power supplies 308-310 in RPS module 112 and healthy electronic devices that are attached to RPS module 112 to support the unhealthy device, the power may be sent to the unhealthy device. To send power to the unhealthy electronic device, DMS 312 may source-disable and sink-enable the unhealthy electronic device via a switchover element (e.g., switchover element 402) that is coupled to RPS buses 314.

If there is insufficient power at parallel power supplies 308-310 in RPS module 112 and the healthy electronic devices to support the unhealthy electronic device, the power priority of the unhealthy electronic device may be compared to the lowest power priority of all unhealthy electronic devices that are being powered by/through RPS module 112 (block 614).

At block 616, if the power priority of the unhealthy electronic device is higher than the lowest power priority, power may be redirected from the lowest power priority device to the unhealthy electronic device. To redirect the power, the lowest power priority device may be sink-disabled and source-disabled, and the unhealthy electronic device may be sink-enabled and source-disabled by DMS 312. If the power priority of the unhealthy electronic device is lower than the lowest power priority, the unhealthy electronic device may be sink-disabled and source-disabled by DMS 312.

From block 616, process 600 may return to block 604 to determine the power level of another device that is attached to RPS module 112. The process may continue to examine power levels at all electronic devices that are attached to PRS module in a round-robin fashion.

In the above, the unhealthy device may not be provided with power if its power priority is low and if there is insufficient power in the system. However, if RPS module 112 is suddenly able to deliver additional power due to the occurrence of an event (e.g., an addition of an extra parallel power supply in RPS module 112, a repair of a broken internal power supply in one of the attached electronic devices, etc.), process 600 may allow the additional power to be delivered to the unhealthy device.

EXAMPLE

Figure 7:
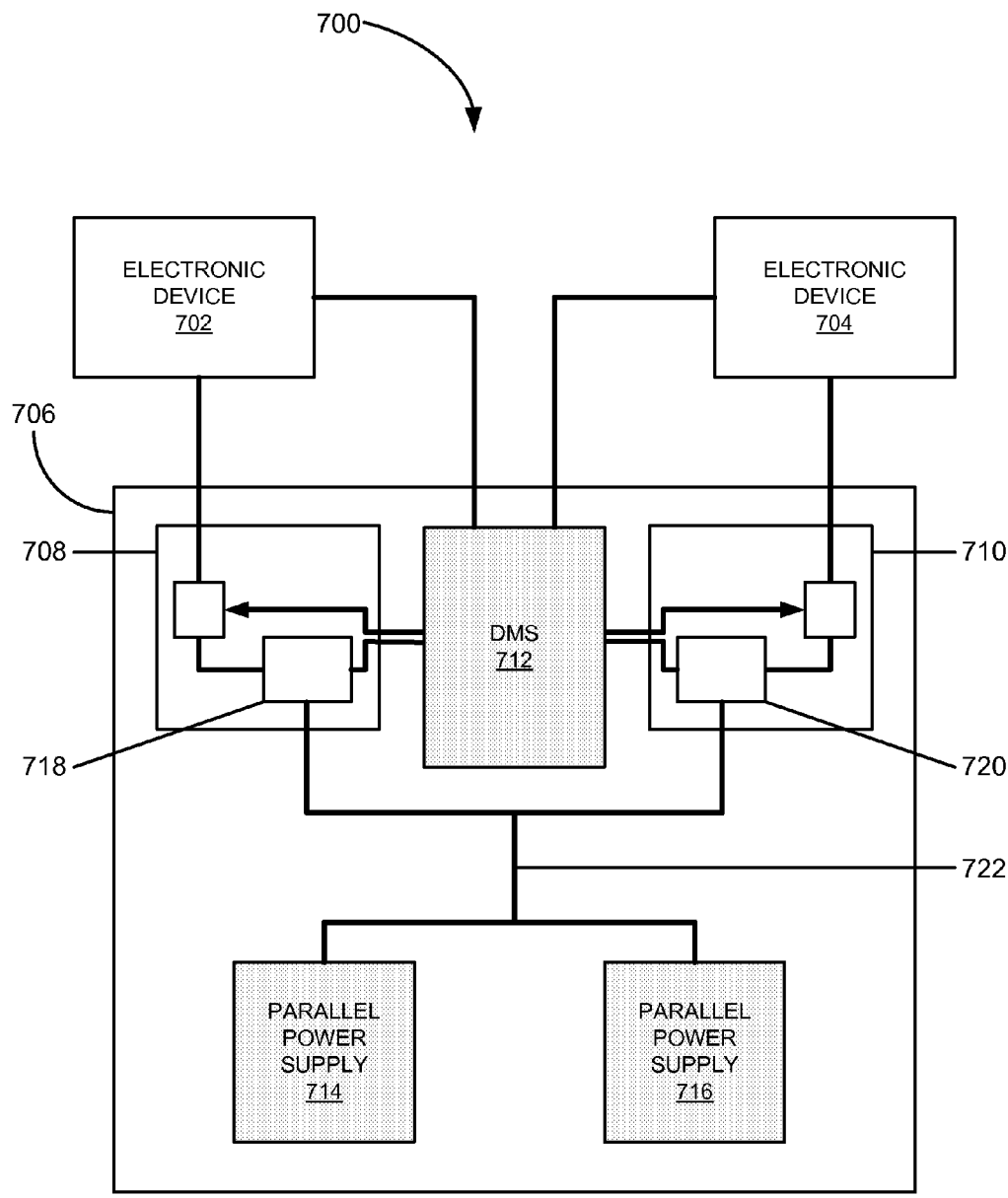
FIG. 7 illustrates the RPS module and the electronic devices of FIG. 1.

The following example illustrates the process for sharing a RPS module, with reference to FIG. 7. The example is also consistent with the exemplary process described above with reference to FIG. 6.

In the example, as illustrated in FIG. 7, assume that a system 700 includes electronic devices 702 and 704; that electronic devices 702 and 704 are connected to path modules 708 and 710 in a RPS module 706, respectively; that RPS module 706 includes path modules 708-710, a DMS 712, and parallel power supplies 714-716. Further, assume that a user has inputted power priorities for electronic devices 702 and 704 as 1 and 2, respectively, via a management station that is connected to RPS module 706 (not shown) and that electronic device 704 has failed.

In the example, DMS 712 measures power levels at electronic device 702. Upon determining that electronic device 702 is healthy, DMS 712 source-enables and sink-disables electronic device 702. To source-enable and sink-disable electronic device 702, DMS 712 may bias the transistor/diode pairs in switchover element 718, so that current can flow from electronic device 702 to parallel buses 722, but not from parallel buses 722 to electronic device 702.

DMS 712 also measures power levels at electronic device 704. Upon determining that electronic device 704 is unhealthy, DMS 712 source-disables and sink-enables electronic device 604. To source-disable and sink-enable electronic device 704, DMS 712 may bias the transistor/diode pairs in switchover element 720, so that current may flow from parallel buses 722 to electronic device 704, but not from electronic device 704 to parallel buses 722.

With path modules 708 and 710 configured by DMS 712, the current from electronic device 702 and parallel power supplies 714 and 716 may flow through parallel buses 722 and transistor/diode pair 720 to unhealthy electronic device 704.

The above example illustrates how a RPS module may reroute power from a healthy electronic device to unhealthy electronic device to provide redundancy against a power supply failure. More generally, if a RPS module with M power supplies supports N electronic devices with total M internal backup power supplies, RPS 112 module and the electronic devices may provide (N+M):N redundancy against power supply failures. Systems that use RPS devices without the capability to reroute power from attached electronic devices may provide only (N+1):N redundancy, assuming each electronic device is equipped with one primary power supply and one backup power supply.

CONCLUSION

The foregoing description of implementations provides illustration, but is not intended to be exhaustive or to limit the implementations to the precise form disclosed. Modifications and variations are possible in light of the above teachings or may be acquired from practice of the teachings.

For example, while series of blocks have been described with regard to processes illustrated in FIG. 7, the order of the blocks may be modified in other implementations. In addition, non-dependent blocks may represent acts that can be performed in parallel to other blocks.

It will be apparent that aspects described herein may be implemented in many different forms of software, firmware, and hardware in the implementations illustrated in the figures. The actual software code or specialized control hardware used to implement aspects does not limit the invention. Thus, the operation and behavior of the aspects were described without reference to the specific software code—it being understood that software and control hardware can be designed to implement the aspects based on the description herein.

Further, certain portions of the implementations have been described as "logic" that performs one or more functions. This logic may include hardware, such as a processor, an application specific integrated circuit, or a field programmable gate array, software, or a combination of hardware and software.

Even though particular combinations of features are recited below in the claims, these combinations are not intended to be limiting the implementations. In fact, many of these features may be combined in ways not specifically recited in the claims.

No element, act, or instruction used in the present application should be construed as critical or essential to the implementations described herein unless explicitly described as such. Also, as used herein, the article "a" is intended to include one or more items. Where one item is intended, the term "one" or similar language is used. Further, the phrase "based on" is intended to mean "based, at least in part, on" unless explicitly stated otherwise.

What is claimed is:

1. A system comprising:
a first device that provides power to a plurality of devices connected to the first device, the first device comprising:
a switchover element to at least one of source power from or sink power to the plurality of devices; and
a controller, connected to the switchover element, to:
determine a power level of a second device, of the plurality of devices, the second device being external to the first device,
determine, based on the power level of the second device, whether a power supply, included in the second device, is operational,
when the power supply, included in the second device, is operational, configure the switchover element to receive power from the second device,
determine a power level of a third device, of the plurality of devices, the third device being external to the first device and being different than the second device,
determine, based on the determined power level of the third device, whether another power supply, included in the third device, is operational, and
configure the switchover element to provide the power, received from the second device, to the third device when the other power supply, included in the third device, is not operational and when the power supply, included in the second device, is operational.

2. The system of claim 1, further comprising:
a first parallel power supply that provides additional power to the second device when the power supply is not operational.

3. The system of claim 2, further comprising:
a second parallel power supply; and
a bus that interconnects the first and the second parallel power supply, the bus preventing power from being delivered to the second parallel power supply from the first parallel power supply when the second parallel power supply fails.

4. The system of claim 1, further comprising N parallel power supplies, the system being connected to electronic devices that include a total of M power supplies, to provide (N+M):N redundancy to the electronic devices.

5. The system of claim 1, where the controller is further to:
receive, via a communication line connected to the second device and from the second device, information identifying a health status of the second device, and
determine, based on the received information identifying the health status, whether the power supply, included in the second device, is operational.

6. The system of claim 1, where the electronic device includes:
zero, one, or more than one internal power supplies to provide additional power to the second device when the power supply is not operational.

7. The system of claim 1, where the controller is further to:
determine whether a bus, that connects the second device to the first device, is not operational, and
cause the second device to be disconnected from the first device when the bus is not operational.

8. The system of claim 1, where the controller is further to:
provide power to the plurality of devices in a particular priority order when power to be provided to the plurality of devices is insufficient,
where, when providing the power to the plurality of devices in the particular priority order, the controller is to:
determine whether a particular priority associated with a particular device, of the plurality of devices, is higher than a lowest priority of a priority associated with each of other devices of the plurality of devices, and
provide power to the particular device when the particular priority is higher than the lowest priority.

9. The system of claim 1, where the switchover element includes a device to prevent current from flowing into the second device when the controller configures the switchover element to provide power, received from the second device, to the third device, and
where the first device enables current to flow to the second device when the power supply, included in the second device, is not operational.

10. A method comprising:
monitoring, by a power supply module, power levels of two or more electronic devices that are connected to the power supply module, the power supply module providing power to the two or more electronic devices, the two or more electronic devices being external to the power supply module;
determining, based on a result of monitoring the power levels, whether power supplies included, respectively, in the two or more electronic devices, are operational;
configuring, by the power supply module, a switchover element to enable a first electronic device, of the two or more electronic devices, to provide power, from the first electronic device, to the power supply module when the power supply, included in the first electronic device, is operational; and
providing, by the power supply module, power from the power supply module to a second electronic device, of the two or more electronic devices, when the power supply, included in the second electronic device, is not operational, the power, provided to the second electronic device, including the power provided by the first electronic device, the second electronic device being different than the first electronic device.

11. The method of claim 10, where monitoring health statuses includes:
sensing a power level of the two or more electronic devices.

12. The method of claim 10, where configuring the switchover element includes:
sink-disabling the first electronic device when the power supply, included in the first electronic device, is operational; and
enabling the first electronic device to provide power, from the first electronic device, to the power supply module when the first electronic device is sink-disabled.

13. The method of claim 10, further comprising:
determining that the power supply, included in the second electronic device, is not operational;
sink-enabling the second electronic device when the power supply, included in the second electronic device, is not operational; and
providing the power, provided by the first electronic device, to the second electronic device when the second electronic device is sink-enabled.

14. The method of claim 10, further comprising:
determining if an internal power supply of the one of the electronic devices is shorted; and
disconnecting the one of the electronic devices from the power supply module.

15. The method of claim 10, where providing power from the power supply module includes:
comparing a power priority of the second electronic device with power priorities of other electronic devices that are receiving power from the power supply module; and
providing the power from the power supply module to the second electronic device when the power priority of the second electronic device is higher than a lowest power priority of the other electronic devices.

16. The method of claim 15, where providing power from the power supply module further includes:
preventing a particular electronic device, of the other electronic devices, with the lowest power priority from receiving power from the power supply module.

17. The method of claim 16, further comprising:
obtaining the power priorities of the other electronic devices.

18. The method of claim 10, further comprising:
determining that the second electronic device is unhealthy when the second electronic device does not include a power supply.

19. The method of claim 10, where monitoring the power levels includes:
receiving, from the first electronic device, information identifying a power level of the first electronic device via a communication link that connects the power supply module to the first electronic device; and
determining, based on the received information identifying the power level, that the power supply, included in the first electronic device, is operational.

20. A system comprising:
a power supply module, that provides power to a plurality of devices, to:
determine whether a first power supply, included in a first device of the plurality of devices that is connected to the power supply module, is operational, the first device being external to the power supply module;
source-enable the first device when the first power supply, included in the first device, is operational;
receive power from the first device, in response to source-enabling the first device;
detect when a second power supply, included in a second device of the plurality of devices that is connected to the power supply module, is not operational, the second device being external to the power supply module, the second device being different than the first device; and
send the power, received from the first device, to the second device, when the second power supply, included in the second device, is not operational.

21. The system of claim 20, where the power supply module is further to:
determine that the first power supply, included in the first device, is not operational based on a power level of the first device,
determine that the second power supply, included in the second device, is operational based on a power level of the second device,
receive power from the second device based on determining that the second power supply, included in the second device, is operational, and
deliver power to the first device based on determining that the first power supply, included in the first device, is not operational,
where the power delivered to the first device includes the power received from the second device.

* * * * *